United States Patent [19]

Bunshah et al.

[11] 4,336,277
[45] Jun. 22, 1982

[54] TRANSPARENT ELECTRICAL CONDUCTING FILMS BY ACTIVATED REACTIVE EVAPORATION

[75] Inventors: Rointan Bunshah, Los Angeles, Calif.; Prem Nath, Troy, Mich.

[73] Assignee: The Regents of the University of California, Berkeley, Calif.

[21] Appl. No.: 191,407

[22] Filed: Sep. 29, 1980

[51] Int. Cl.³ ............................................ C23C 13/12
[52] U.S. Cl. .................................... 427/38; 118/50.1; 118/723; 204/193; 427/42; 427/50; 427/126.3
[58] Field of Search .................... 427/38, 39, 42, 109, 427/126.3; 204/193; 118/723, 50.1

[56] References Cited

U.S. PATENT DOCUMENTS

| | | | |
|---|---|---|---|
| 2,200,909 | 5/1940 | Berghaus et al. | |
| 2,501,563 | 3/1950 | Colbert et al. | 427/39 |
| 2,904,452 | 9/1959 | Reichelt | |
| 2,920,001 | 1/1960 | Smith et al. | |
| 3,419,487 | 12/1968 | Robbins et al. | 427/39 |
| 3,607,368 | 9/1971 | Amstel | |
| 3,649,502 | 3/1972 | Herte et al. | |
| 3,655,438 | 4/1972 | Sterling et al. | |
| 3,758,803 | 9/1973 | Cook et al. | |
| 3,791,852 | 2/1974 | Bunshah | 427/38 |
| 3,860,444 | 1/1975 | Donckel et al. | |
| 3,891,941 | 6/1975 | Roberts et al. | |
| 4,010,291 | 3/1977 | Katsube et al. | 427/109 |
| 4,058,638 | 11/1977 | Morton | 427/39 |

FOREIGN PATENT DOCUMENTS

| | | | |
|---|---|---|---|
| 52-59888 | 5/1977 | Japan | 427/109 |
| 55-104328 | 8/1980 | Japan | 427/126.3 |

*Primary Examiner*—John H. Newsome

[57] ABSTRACT

Process and apparatus for producing transparent electrical conducting thin films by activated reactive evaporation. Thin films of low melting point metals and alloys, such as indium oxide and indium oxide doped with tin, are produced by physical vapor deposition. The metal or alloy is vaporized by electrical resistance heating in a vacuum chamber, oxygen and an inert gas such as argon are introduced into the chamber, and vapor and gas are ionized by a beam of low energy electrons in a reaction zone between the resistance heater and the substrate. There is a reaction between the ionized oxygen and the metal vapor resulting in the metal oxide which deposits on the substrate as a thin film which is ready for use without requiring post deposition heat treatment.

21 Claims, 1 Drawing Figure

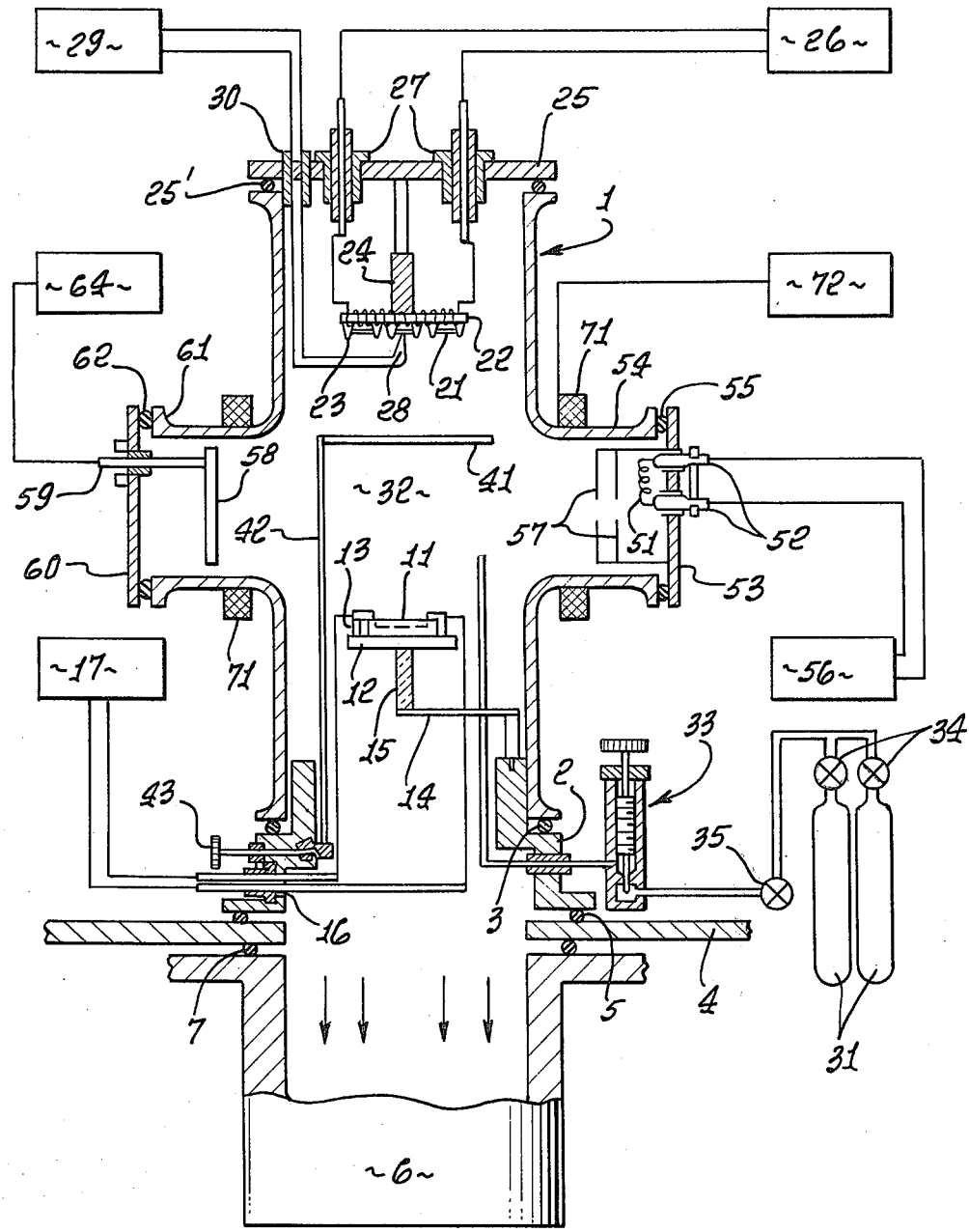

TRANSPARENT ELECTRICAL CONDUCTING FILMS BY ACTIVATED REACTIVE EVAPORATION

The Government has rights in this invention pursuant to Contract No. DE-AC04-79-ET-23008 awarded by the U.S. Department of Energy.

BACKGROUND OF THE INVENTION

This invention relates to process and apparatus for the preparation of transparent electrically conducting thin films for use in a variety of opto-electronic applications such as antistatic coatings, photoconductor storage devices, liquid crystal and electrochromic diaplays, photovoltaic heterojunctions and photothermal absorption devices.

To date, transparent conducting coatings of a variety of oxides such as CdO, $SnO_2$, $In_2O_3$, $In_2O_3$:Sn, and $Cd_2SnO_4$, etc., have been prepared by a variety of techniques such as chemical vapor deposition (hydrolysis of chlorides, pyrolysis), evaporation and sputtering of ultra thin metal films (metal films on amorphous substrates, metal films deposited on nucleation modifying layers, post-oxidation of thin metal films), reactive evaporation (evaporation of pure metals, evaporation of oxides), and sputtering (reactive sputtering, sputtering of oxide targets). The status of various transparent conducting coatings can be found in review articles by J.L. Vossen, (Physics of Thin Films, Eds. G. Haas, M. H. Francombe and R. W. Hoffman, Academic Press, Vol. 9, 1, 1977) and G. Haacke, (Ann. Rev. Mater. Sci., 7, 73, 1977).

It is an object of this invention to provide process and apparatus for the production of high quality transparent and electrical conducting coatings such as of $In_2O_3$ and Sn:$In_2O_3$, by a modified activated reactive evaporation of metal or alloy.

A variety of reactive evaporation processes are reported in the literature for producing a variety of compound films. To the best of applicants knowledge, the only way in which the reactive evaporation technique has been utilized to prepare transparent conducting coatings is simple evaporation in the presence of $O_2$, (i.e., without the presence of a plasma to activate the reaction). It may be pointed out that the films had poor electrical and optical characteristics (see for example J. L. Vossen, Physics of Thin Films, Eds. G. Haas, M. H. Francombe and R. W. Hoffman, Vol. 9, 1, 1977).

Activation of the reactive evaporation process has been reported in the literature. In U.S. Pat. No. 3,791,852 to Bunshah, thick films of Ti, Hf, V, Nb and Zr carbides are produced by activated reactive evaporation using an electron beam heated evaporation source for metal atoms and hydrocarbon gas for the carbon atoms in the carbide phase. The reaction is activated by placing a positively biased electrode in the reaction zone between the evaporation source and the substrate. The mechanism of activation is as follows: The primary biased electrode (20 to 200 volts) establishes an electric field which extracts low energy secondary electrons from this plasma sheath into the reaction zone. These low energy electrons have a very much higher ionization probability (factor of 10-20) than the high voltage primary electrons, and ionize both the metal and gas atoms to form the corresponding ions. These ions then collide with neutral atoms forming energetic neutral atoms and new ions as a result of charge exchange processes. Thus the reaction zone contains highly active species, i.e., ions and energetic neutrals as well as neutral atoms and electrons. These specie then react to form the compound.

In U.S. Pat. No. 2,920,002 to Auwater, thin film ozides of Si, Zr, Ti, Al, An, and Sn are produced by reactive exaporation. The reaction is activated by passing the reaction gas ($O_2$) through an ionization chamber located outside the vacuum chamger and having two electrodes with a potential of several thousand volts across them. Magnetic field ionization of $O_2$ on its way to vacuum chamber has also been used. In U.S. Pat. No. 3,419,487 to Robbins, thin film semiconductors are produced by evaporating a metal and directing a gas into a zone at relatively high pressure (80-90 microns or mercury) and using a high voltage (1470 volts) to generate high energy electrons producing a glow discharge in the zone and subjecting the anode substrate to electron bombardment. Aluminum nitride films have been produced by evaporating Al from an r.f. heater crucible and reacting the Al deposited on the substrate with $N_2$ gas which has been dissociated by an a.c. discharge on the $N_2$ feed tube, by M. T. Wank and D. K. Winslow (Appl. Phys. Lett. 13, 286, 1968). Microwave discharge located in the line between the gas source and vacuum chamber has been utilized by B. B. Kosicki and D. Khang (J. Vac. Sci. Tech. 6, 592, 1969, and U.S. Pat. No. 3,551,312) for depositing GaN films.

However none of the prior processes have produced transparent conducting coatings of $In_2O_3$ and Sn-doped $In_2O_3$ and other similar oxide coatings of low melting point metals by an activated reactive evaporation technique. It is a particular object of the invention to provide process and apparatus which yields films having sheet resistance in the range of 2 to 100 ohms/square and an average transmittance between 0.9 and 0.97.

SUMMARY OF THE INVENTION

The preferred embodiment of the process for depositing a transparent electrical conducting film on a substrate by activated reactive evaporation includes supporting the substrate in a vacuum, preferably heating the substrate, evaporating a low melting point metal or alloy by resistive heating producing a metal vapor in zone between the resistance heat source and the substrate, introducing oxygen gas into the zone, alone or with an inert gas such as argon, and directing a beam of low energy electrons through the zone for colliding with the gas and metal atoms producing ions and energetic neutral atoms which react with each other and with neutral metal and gas atoms in the zone resulting in a metal oxide deposit on the substrate. The beam of low energy electrons preferably is produced by a cathode and an anode arrangement with a potential in the order of 100 volts there across. Also preferably a magnetic field is provided along the electron beam path between cathodes and anode so as to produce a helical electron movement increasing the path length and enhancing the opportunity for collisions between electrons and gas or metal atoms.

The preferred embodiment of the apparatus for producing the transparent electrical conducting thin films includes a vacuum chamber, an electrical resistance heater mounted in the chamber, a substrate holder mounted in the chamber and spaced from the heater with the reaction zone therebetween, preferably means for heating the substrates, means for directing gas or gases into the zone, and a source of a beam of low energy electrons mounted in the chamber for directing the electron beam into the zone. Preferably the apparatus also includes coils for generating a magnetic field in the zone to produce the desired helical electron path.

BRIEF DESCRIPTION OF THE FIGURE

The single FIGURE of the drawing is a schematic vertical sectional view of a vacuum chamber and associated equipment suitable for performing the process of the invention and incorporating the presently preferred embodiment of the apparatus of the invention.

DESCRIPTION OF THE PREFERRED EMBODIMENT

The deposition apparatus includes a vacuum chamber 1 resting on a base ring 2 with a gasket 3 therebetween. The base ring rests on a base plate 4 with a sealing gasket 5. The base plate is connected to a high vacuum module 6, with a sealing gasket 7 therebetween. The high vacuum pumping module desirably should be capable of pumping the vacuum chamber to a pressure of $<2\times10^{-6}$ Torr. The chamber and the various components are held together by conventional clamps, which are omitted from the drawing for reasons of clarity.

The evaporation source includes a tungsten boat 11 clamped onto a copper block 12. One clamp is isolated by a threaded ceramic 13. The evaporation assembly is mounted onto a stainless steel platform 14 via a ceramic mount 15, and the stainless steel platform 14 is mounted onto the base ring 2. The power to the evaporation source is supplied by two electrical feedthroughs 16 connected to an isolated power supply 17.

The substrates 21 to be coated are mounted on substrate heater assembly 22 via clamps 23. The substrate heater assembly is supported on a ceramic mount 24 which in turn is mounted onto a stainless steel plate 25 positioned at the top end of the vacuum chamber 1, with a gasket 25'. The power for the heater assembly 22 is supplied from an isolated power supply 26 via electrical feedthroughs 27 mounted on the plate 25. The temperature of the substrate is monitored by a thermocouple 28 bonded onto a dummy substrate, with the thermocouple connected to a temperature indicator 29 via the electrical feedthroughs 30.

High purity reaction gases from cylinders 30 can be bled into the reaction zone 32 within the chamber 1. A precision leak valve 33 is used to control the pressure of the gases in the vacuum chamber. A desired ratio of gases, typically argon and oxygen, can be maintained by adjusting the control valves 34 and 35.

A shutter 41, mounted on a rod 42, is manually rotatable by knob 43 to move the shutter into or out of position between the evaporation source 11 and substrates 21.

An electron emitter assembly consisting of a thoriated tungsten emitter 51, made by winding a 10 mil wire on a 1/16" mantle, is mounted on two isolated feedthroughs 52 which are fixed on a stainless steel plate 53. The stainless steel plate 53 is mounted to the side flank 54 of the vacuum chamber, with a sealing gasket 55. The power to the emitter 51 is supplied by a power supply 56. In front of the emitter assembly are two shields 57, held at ground potential. Anode plate 58 is screwed on to an isolated feedthrough 59 which is mounted on another stainless steel plate 60. The plate 60 is clamped to the flange 61, with a sealing gasket 62 therebetween. A positive potential with respect to the emitter 51 is applied to the anode assembly by a power supply 64.

Two magnetic field coils 71 are fixed onto the side flanges 63 and 61 of the vacuum chamber 1, and are energized by a power supply 72.

The pumping station 6 utilized for evacuating the vacuum chamber 1 may be a 6" diffusion pump module with a liquid $N_2$ trap.

The most commonly used substrates are $0.1"\times1"\times1"$ slide glass, quartz, and Corning 7059 glass. The substrate heater should be capable of maintaining the substrates at temperatures between 25° to 500° C. and higher.

The evaporation materials are low melting point metals or alloys of high purity. For purposes of this application, low melting point metals are those with a melting point less than 450° C., such as indium, tin, cadmium and zinc, as contrasted to aluminum, copper, nickel, iron, chromium, vanadium, titanium and molybdenum which have melting points in the range of 660° to 2600° C. Indium or indium-tin alloys with concentrations between 10-20 wt.% of tin are preferred. The alloys are made by vacuum melting the constituents in a pressure of $<2\times10^{-6}$ Torr.

The power supply 56 for the emitter assembly is a variable output a.c. power supply with an output rating of 500 volt amp. The power for the anode is supplied by a 200 volt 6 amp regulated d.c. supply 64. The power to the substrate heater is provided by an isolated variable 2 KVA transformer 26. The evaporation source is energized by a 4 KVA isolated low voltage a.c. supply 17, typically 10-20 volts. The reaction gases preferably are high purity (99.999%) Ar and hydrocarbon free $O_2$.

The position of the substrate heater assembly and the metal evaporation source can be interchanged to yield downward evaporation. This geometry of evaporation requires no clamping of substrates as these rest on the substrate heater.

Typical Operating Sequence

The vacuum chamber is initially pumped down to $2\times10^{-6}$ Torr. With the shutter in position between the metal source and the substrate, the substrate heater is switched on and the substrate heated to the desired temperature such as 350° C. The evaporation source is energized to 25% of the power required for evaporation for warm up and outgassing. The tungsten emitter is energized to a filament current of 8 amps. A potential of 100 volts is applied to the anode. Argon is now bled into the vacuum chamber until a plasma is established in the reaction zone. Current to the magnetic field coils is switched on. The pressure is now adjusted to $1\times10^{-4}$ Torr. By Adjusting the anode potential an anode current 3 amp is obtained. Oxygen is now bled into the vacuum chamber slowly while decreasing the argon pressure. After 15 minutes of stabilization, the power to the evaporation source is increased slowly. The shutter is now removed and films are deposited for typically 5-10 minutes. The reaction between metal vapor and reaction gas is indicated by a change in color of the plasma from light pinkish blue to deep blue. After the deposition, the gas supply is cut off and power to substrate heating is switched off. The coated substrates are removed after they have cooled down to room temperature.

It has been determined that maximum efficiency of ionization is achieved with an electron energy in the range of about 20 to about 200 volts, with the preferred value in the order of 100 volts, and this may be obtained by adjusting the anode power supply 64.

The process may be carried out with oxygen alone, but it is preferred to use an inert gas to provide increased ionization. Argon usually is used because of its availability and relatively low cost. The amount of oxygen used is determined by the desired reaction. Usually a relatively small amount of oxygen is required and this limits the amount of ionization which can be produced. By adding argon or other inert gas, the amount of ionization may be increased without affecting the stoichiometry or properties of the deposited films.

Indium oxide films and tin doped indium oxide films presently are preferred. However the process also may be used to produce tin oxide, cadmium oxide and cadmium stannate films. The electron beam vaporization process is not suitable for use with these low melting materials. In order to melt such metals, a low current density beam would be used and such a beam does not readily produce the desired plasma layer on the metal from which the low energy electrons can be extracted to ionize the metal and gas atoms and activate the reaction. If the beam current density is increased to where the desired plasma may be produced, the beam energy is so great that metal splattering occurs.

Typical Results

It is observed that the sheet resistance and transmittance of films produced by this process are a function of various deposition parameters such as substrate temperature, ambient pressure, thickness of deposit and substrate material.

X-ray diffractometer measurements on pure $In_2O_3$ and doped $In_2O_3(Sn)$ films show that the films have cubic $Tl_2O_3$ bixbyte structure. Bulk $In_2O_3$ has the same structure. In the $In_2O_3(Sn)$ films, no $SnO_2$ phase is detected, implying that Sn replaces In in the bcc lattice and the films are homogeneous.

Transmittance has been measured as a function of wavelength for pure $In_2O_3$ and $In_2O_2(Sn)$ films. It is seen that all films show an optical absorption edge at 0.35 $\mu$m (3.54) ev. It is seen that $In_2O_3(Sn)$ films with a sheet resistance of 25 ohms/square have an average transmittance of 0.97 between 0.4 and 1.6 $\mu$m thickness. A thicker $In_2O_3(Sn)$ film has a sheet resistance of 2.2 ohms/square and an average transmittance of 0.88 between 0.42 and 1.1 $\mu$m thickness. Pure $In_2O_3$ films have a sheet resistance of 80 ohms/square and an average transmittance of 0.97.

For the indium-tin alloy oxide films deposited at 300° C., the resistance decreases rapidly with increasing Sn concentration up to 18 wt.% Sn in the In-Sn alloy. Beyond 20 wt.% Sn, good quality films could not be obtained. While the sheet resistance is a strong function of tin content, the transmittance is only weakly dependent on it. Results indicate that the optimum tin concentration for obtaining the lowest sheet resistance and highest figure of merit ($T^{10}/R_s$) is 15–18 wt.% tin in the alloy. It may be pointed out that the exact role of tin in determining the properties is far from clear. The optimum tin content has been found to be different (from few up to 20%) by different workers in films prepared by different techniques.

For the $In_2O_3$:Sn films, with Sn concentrations of 18 wt.% in the In-Sn alloy, electrical resistivity varies as a function of deposition temperature. The electrical resistivity decreases monotonically with increasing temperature of deposition up to 250° C. Beyond 250° C., the electrical resistivity decreases very rapidly. While the electrical resistivity is a strong function of the substrate temperature, the transmittance is only weakly dependent on it. It may be pointed out that all $In_2O_3$:Sn films deposited at temperatures ranging from 50° to 370° C. exhibit sharp optical absorption edges. The electrical resistivity of $In_2O_3$:Sn (with Sn concentration of 18 wt.% in the alloy) films varies with deposition temperature and has been measured over the range of room temperature to 370° C. It is seen that the room temperature deposited films show semiconducting behavior with activation energy of conduction decreasing with decreasing temperature. The activation energy of conduction is between 0.015 and 0.027 eV, indicating the shallow nature of doping levels. With increasing deposition temperature, the resistivity dependence on temperature becomes weaker and beyond 150° C., the resistivity behavior changes from one decreasing with temperature to one increasing with temperature. Hall effect studies indicate that the electrical conductivity is n-type and the films have a Hall mobility of 20–30 cm$^2$ V-Sec and a carrier concentration $\sim 10^<$ cm$^{-3}$.

The observed dependence of the electrical resistivity on deposition temperature can be qualitatively understood in terms of (1) oxygen vacancies and (2) microstructure and crystallinity of the deposits. Lower deposition temperature leads to stoichiometric oxide films. This is indicated by the sharp absorption edge and high degree of transparency in the wavelength range of 0.4–1.2 $\mu$m. Increasing the deposition temperature leads to oxygen deficient films. The oxygen vacancies thus created are responsible for the higher conductivity. This is well known in literature. It is seen that room temperature deposited films have no decernible microstructure. The films exhibit a broad halo type diffraction pattern. Increasing the deposition temperature results in highly crystalline films with crystallite size increasing with increasing temperature of deposition. This is indicated by the electron diffraction patterns which also show preferred orientation.

We claim:

1. In a process for depositing a transparent electrical conducting film on a substrate by activated reactive evaporation, the steps of:

supporting the substrate in a vacuum;

evaporating a low melting point metal or alloy by resistive heating of the solid material producing a metal vapor in a zone between the resistance heat source and the substrate, with the substrate above the resistance heat source so that the metal vapor moves upward from the heat source toward the substrate;

introducing oxygen gas into the zone;

extracting low energy electrons from a heated cathode by a dc electric field directed across the path of the metal vapor in the zone between the resistance heat source and the substrate, which electric field is produced by applying an electrical potential between cathode and anode of about 20 to about 200 volts;

directing a beam of the low energy electrons laterally through the zone for colliding with the gas and metal atoms producing gas and metal ions and energetic neutral atoms which react with each other and with neutral metal and gas atoms in the zone resulting in a metal oxide deposit on the substrate; and providing a magnetic field along the beam of electrons so that electrons travel in a helical path in the zone.

2. The process as defined in claim 1 including directing the beam of electrons from a heated cathode to an anode separate from the substrate, with an electrical potential connected across the anode and cathode.

3. The process as defined in claim 2 including introducing an inert gas into the zone.

4. The process as defined in claim 3 wherein said inert gas is argon.

5. The process as defined in claim 4 including heating the substrate to a predetermined temperature to control the electrical and optical properties of the deposited film.

6. The process as defined in claim 5 wherein the low melting point metal or alloy has a melting point less than about 450° C.

7. The process as defined in claim 5 wherein the metal or alloy is selected from the group consisting of indium, tin, and mixtures thereof.

8. The process as defined in claim 7 including producing producing the low energy electrons by applying an electrical potential across the anode and cathode in the order of 100 volts.

9. The process as defined in claim 1 including introducing an inert gas with the oxygen gas.

10. The process as defined in claim 1 including introducing argon gas with the oxygen gas.

11. The process as defined in claim 1 including introducing the low energy electrons by applying an electrical potential across a cathode and anode of about 20 to about 200 volts.

12. The process as defined in claim 1 wherein the metal or alloy is selected from the group consisting of indium, tin, and mixtures thereof.

13. The process as defined in claim 1 wherein the low melting point metal or alloy has a melting point of less than about 450° C.

14. The process as defined in claim 1 including heating the substrate.

15. In an apparatus for producing transparent electrical conducting thin films by activated reactive evaporation, the combination of:
a vacuum chamber;
an electrical resistance heater mounted in said chamber;
means for connecting an electrical power supply to said heater;
a substrate holder mounted in said chamber spaced upward from said heater with a reaction zone therebetween and defining a first metal vapor path from said heater upward to said holder through said zone;
means for directing a gas into said zone;
a source of a beam of low energy electrons mounted in said chamber for directing an electron beam into said zone along a second electron path transverse to said first path; and
magnetic means for providing a magnetic field along said second path to cause said low energy electrons to travel in helical paths.

16. An apparatus as defined in claim 15 wherein said source of low energy electrons includes a cathode and an anode positioned on opposite sides of said zone separate from said substrate holder.

17. An apparatus as defined in claim 16 including an electrical power supply providing voltage across said anode and cathode in the range of about 20 to about 200 volts.

18. An apparatus as defined in claim 16 including an electrical power supply providing voltage across said anode and cathode in the order of 100 volts.

19. An apparatus as defined in claim 16 including means for directing a first gas and second gas into said zone and means for controlling the ratio of said first and second gases.

20. An apparatus as defined in claim 15 wherein said magnetic means includes first and second coils spaced from each other along the path from said cathode to said anode, and means for connecting an electrical power source to said coils.

21. An apparatus as defined in claim 15 including means for heating substrates mounted on said substrate holder to a predetermined temperature to control the electrical and optical properties of the deposited films.

* * * * *